(12) United States Patent
Miyagawa

(10) Patent No.: US 7,132,599 B2
(45) Date of Patent: Nov. 7, 2006

(54) CIRCUIT BOARD

(75) Inventor: Tomoyuki Miyagawa, Nukata-gun (JP)

(73) Assignee: Denso Corporation, Kariya (JP)

( * ) Notice: Subject to any disclaimer, the term of this patent is extended or adjusted under 35 U.S.C. 154(b) by 189 days.

(21) Appl. No.: 10/795,429

(22) Filed: Mar. 9, 2004

(65) Prior Publication Data
US 2004/0179347 A1    Sep. 16, 2004

(30) Foreign Application Priority Data
Mar. 10, 2003   (JP)  .............................. 2003-062898

(51) Int. Cl.
*H05K 9/00*   (2006.01)
(52) U.S. Cl. ........................................ 174/36; 361/818
(58) Field of Classification Search ................ 361/818, 361/777, 778, 794–5, 792–793; 174/36, 174/255

See application file for complete search history.

(56) References Cited

U.S. PATENT DOCUMENTS

| | | | |
|---|---|---|---|
| 4,801,489 A | | 1/1989 | Nakagawa et al. |
| 5,652,508 A | * | 7/1997 | Yamamoto .................. 324/166 |
| 5,981,043 A | * | 11/1999 | Murakami et al. .......... 428/209 |
| 6,486,394 B1 | * | 11/2002 | Schmidt et al. ................ 174/36 |
| 6,777,622 B1 | * | 8/2004 | Ueno et al. .................. 174/262 |
| 2004/0118600 A1 | * | 6/2004 | Lee et al. .................... 174/260 |
| 2005/0122030 A1 | * | 6/2005 | Sakamoto et al. .......... 313/496 |

FOREIGN PATENT DOCUMENTS

| | | |
|---|---|---|
| JP | A-H2-022885 | 1/1990 |
| JP | U-H4-026599 | 3/1992 |
| JP | A-2000-138425 | 5/2000 |
| JP | A-2001-336955 | 12/2001 |

* cited by examiner

*Primary Examiner*—Kamand Cuneo
*Assistant Examiner*—Yuriy Semenenko
(74) *Attorney, Agent, or Firm*—Posz Law Group, PLC

(57) ABSTRACT

A circuit board includes a printed circuit board layer, an insulating layer, and an electromagnetic interference sealed layer. The printed circuit board layer includes an insulating substrate on which circuit patterns are printed. The insulating layer covers the circuit patterns. The sealed layer covers the insulating layer and connected with a ground portion of the circuit patterns. The sealed layer that is formed by screen printing conductive paste has through holes. Edges are formed around the through holes other than the outer edges, and a total area of edges at which the thickness of the printed conductive paste is large due to surface tension increases. Thus, the sealed layer can be easily formed in a predetermined thickness, and stability in conductivity of the sealed layer can be maintained.

14 Claims, 6 Drawing Sheets

CIRCUIT BOARD

CROSS REFERENCE TO RELATED APPLICATION

This application is based on and incorporates herein by reference Japanese Patent Application No. 2003-62898 filed on Mar. 10, 2003.

FIELD OF THE INVENTION

The present invention relates to a circuit board, on which electrically conductive paste is screen printed.

BACKGROUND OF THE INVENTION

A circuit board on which electrically conductive paste is screen printed is proposed in U.S. Pat. No. 4,801,489 (JP-B-6-34472). The circuit board includes a printed circuit board layer, an insulating layer, and an electromagnetic interference sealed layer. The printed circuit board layer includes an insulating substrate on which circuit patterns are printed. The insulating layer and the sealed layer cover the printed circuit patterns and the insulating layer, respectively. The sealed layer is formed by screen printing conductive paste on top of the insulating layer, and connected with a ground electrode portion.

With this configuration, distributed capacitance is produced between the circuit patterns and the sealed layer rather than between the adjacent circuit patterns. Since the sealed layer is connected with a ground electrode portion, spurious radiation can be reduced.

When the sealed layer is simply screen printed, a film thickness of the layer around the center is thinner than that around outer edges due to a surface tension as shown in FIG. 9. As a result, the conductivity of the sealed layer is unstable. To solve this problem, a larger amount of the conductive paste may be applied to increase an overall thickness of the layer. However, there is a limit to the amount of the conductive paste that is squeezed out by a squeegee in one stroke. Therefore, it is required to repeat steps for screen printing the conductive paste when applying the conductive paste more than the limit.

Moreover, the same problem occurs when screen printing connecting lines such as jumper lines. In this case, electrical resistance of the lines is difficult to estimate, and it affects circuit designing. Variations in the film thickness are also caused by the moving direction of the squeegee during screen printing. This even increases inconvenience in the circuit designing.

The relationship between the moving direction of the squeegee during screen printing and the variations in the film thickness is discussed referring to FIG. 9A. When the direction in which a connecting line extends is parallel to the longitudinal direction of the squeegee set in a position for the screen printing, which is the lateral direction of FIG. 9A, a gap between screen masks 4 is wide. As a result, a screen 3 is largely sagged by a squeegee 2 and a clearance between the screen 3 and a printing surface becomes small. A large amount of conductive paste is squeezed out of an insulating substrate 12 by the squeegee 2, and therefore the line is formed in a small thickness.

SUMMARY OF THE INVENTION

The present invention therefore has an objective to provide a circuit board having conductive paste screen printed on an insulating substrate in a predetermined thickness. A circuit board of the present invention includes a printed circuit board layer, an insulating layer, and an electromagnetic interference sealed layer. The circuit board layer includes an insulating substrate on which circuit patterns are printed. The insulating layer is formed on top of the circuit board layer for covering the printed circuit patterns. The sealed layer is formed on top of the insulating layer for covering the insulating layer by screen printing conductive paste, and connected with a ground portion of the circuit patterns. The sealed layer has through holes.

In the sealed layer, edges are formed around the through holes other than the outer edges, namely, a total area of edges at which the thickness of the printed conductive paste is large due to surface tension increases. Thus, the sealed layer can be easily formed in a predetermined thickness, and stability in conductivity of the sealed layer can be maintained.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENT

Figure 1:
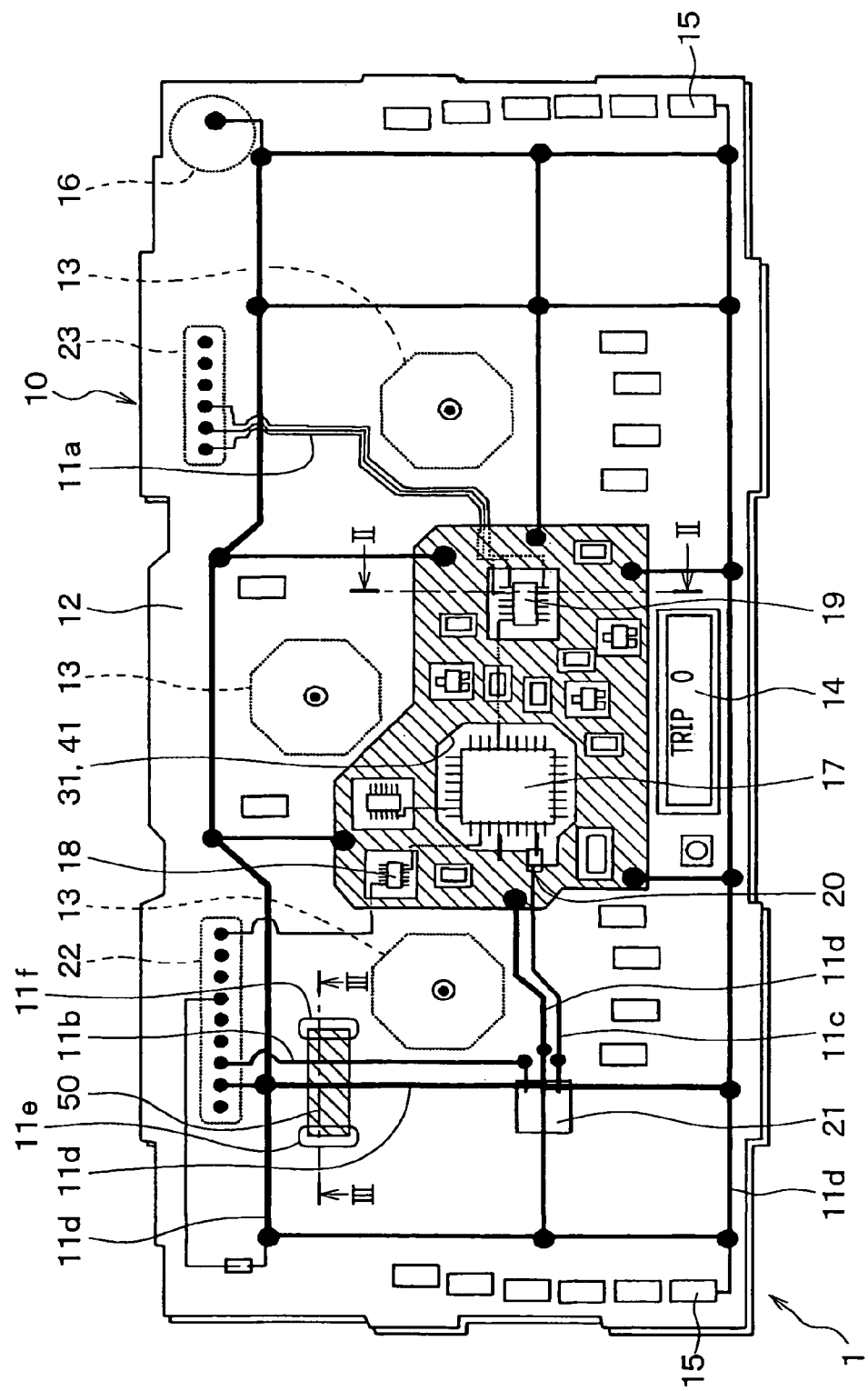
FIG. 1 is a top view of a circuit board according to the embodiments of the present invention.

The preferred embodiments of the present invention will be explained with reference to the accompanying drawings. In the drawings, the same numerals are used for the same components and devices.

[First Embodiment]

Referring to FIG. 1, a circuit board 1 includes a printed circuit board (PCB) 10, and various electronic components 13–23 mounted on the PCB 10. The PCB 10 has an insulating substrate 12 on which printed circuit patterns are formed. The insulating substrate 12 is a rigid board made of an insulating material such as a glass epoxy material. A flexible board made of a film including a polyester film and a polyimide film may be used for the insulating substrate 12.

The printed circuit patterns include signal lines 11a, power lines 11b, 11c, and ground lines 11d formed on one side of the insulating substrate 12 by etching copper films. The electronic components include a stepper motor 13, a liquid crystal display panel (LCD) 14, light-emitting diodes (LEDs) 15, a warning buzzer 16, a CPU 17, a communication IC 18, a parallel-to-serial conversion IC 19, a bypass capacitor 20, a power regulator 21, a power connector 22, and a vehicle information network connector 23.

The stepper motor 13 for rotating a needle of a meter is arranged on the rear side of the insulating substrate 12, and its rotating shaft is extended to the front side through the insulating substrate 12. The LEDs 15 are light sources for display panels (not shown). The warning buzzer 16 provides warnings regarding vehicle conditions to a user.

The CPU 17 receives vehicle information including a vehicle speed, a fuel level, an engine speed, and oil temperatures. It outputs control signals to the step motor 13, the LCD 14, the LED 15, and the buzzer 16 based on the vehicle information. The communication IC 18 performs communication between a multiplex communication network constructed of various control ECU and the CPU 17 in a vehicle. The communication IC 18 sends and receives data to and from the CPU 17. It also sends and receives data frames within a network between the control ECUs.

The parallel-to-serial conversion IC 19 converts parallel signals outputted form the CPU 17 to serial signals. The bypass capacitor 20 connected with the CPU 17 and the ICs 18, 19 protects the other electronic components from high frequency signals outputted from the CPU 17.

The power regulator 21 provides power supply to electronic components. More specifically, the power regulator 21 converts a 12-volt battery voltage to a 5-volt voltage. An input terminal of the power regulator 21 is connected with the power connector 22 via the power line 11b. An output terminal of the power regulator 21 is connected with the power line 11c that is connected with power terminal of electronic components including the CPU 17. One of the ground lines 11d (first ground line) is extended from the power connector 22. Other ground lines 11d are extended from a connecting point with the first ground line lid in the horizontal or the vertical direction on the insulating substrate 12 via a ground terminal position of the power regulator 21. The vehicle information network connector 23 is mounted on the insulating substrate 12 and used for connecting communication lines of the communication network and outputting the serial signals.

Because the CPU 17 produces clock signals that are high frequency signals, it could be a source of noise in the frequency range of the clock signals or their harmonic signals. Noise current may flow from the CPU 17 to the ICs 18, 19 via the circuit patterns because the ICs 18, 19 perform communication with the CPU 17. As a result, electromagnetic noise may be produced due to a current loop starting from the CPU 17, continuing to the communication IC 18, the printed circuit patterns, the power regulator 21, the printed circuit patterns, and returning to the CPU 17. The electromagnetic noise may be produced due to another current loop starting from the CPU 17, continuing to the parallel-to-serial conversion IC 19, the printed circuit patterns, the power regulator 21, the printed circuit patterns, and returning to the CPU 17.

Spurious radiation noise originates from such noise can be reduced by the following method. A target frequency range in which noise is required to be reduced for proper operation of a system is determined based on an operation frequency of the system. For instance, the frequency range is determined based on a range of 300 MHz to reduce noise for proper operation of a keyless entry system. If the CPU 17 produces clock signals or their harmonic signals in this frequency range, it is determined as a source of noise.

Figure 2:
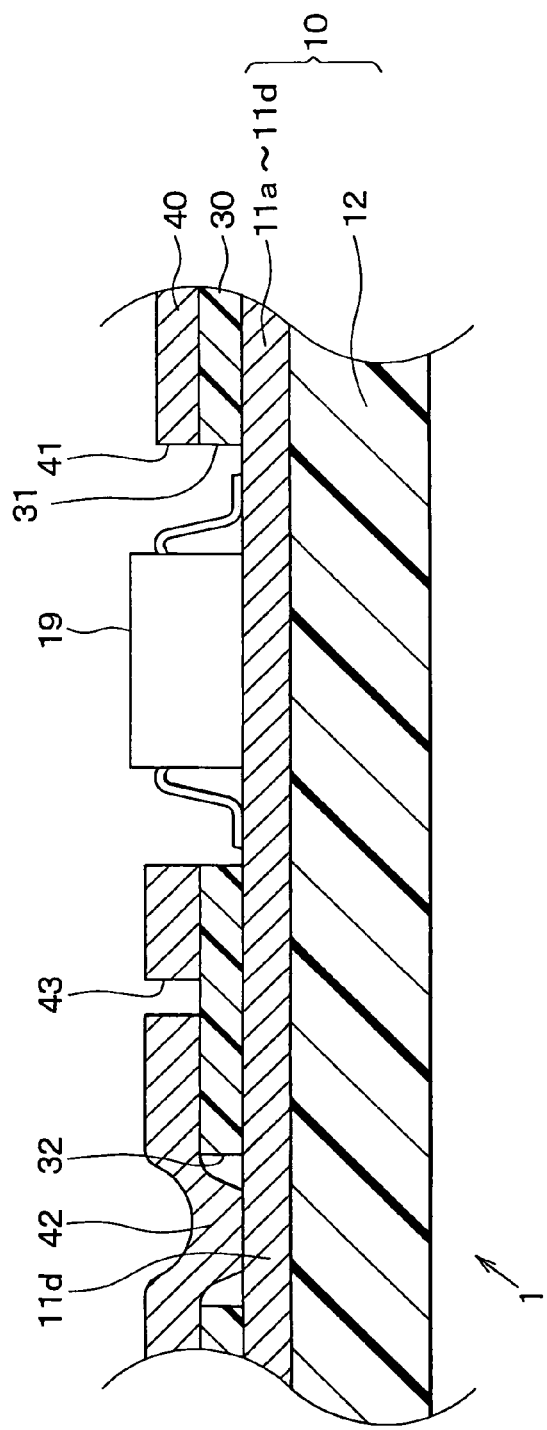
FIG. 2 is a cross-sectional view of the circuit board shown in FIG. 1 sectioned by line II—II according to the first embodiment of the present invention.
Figure 3:
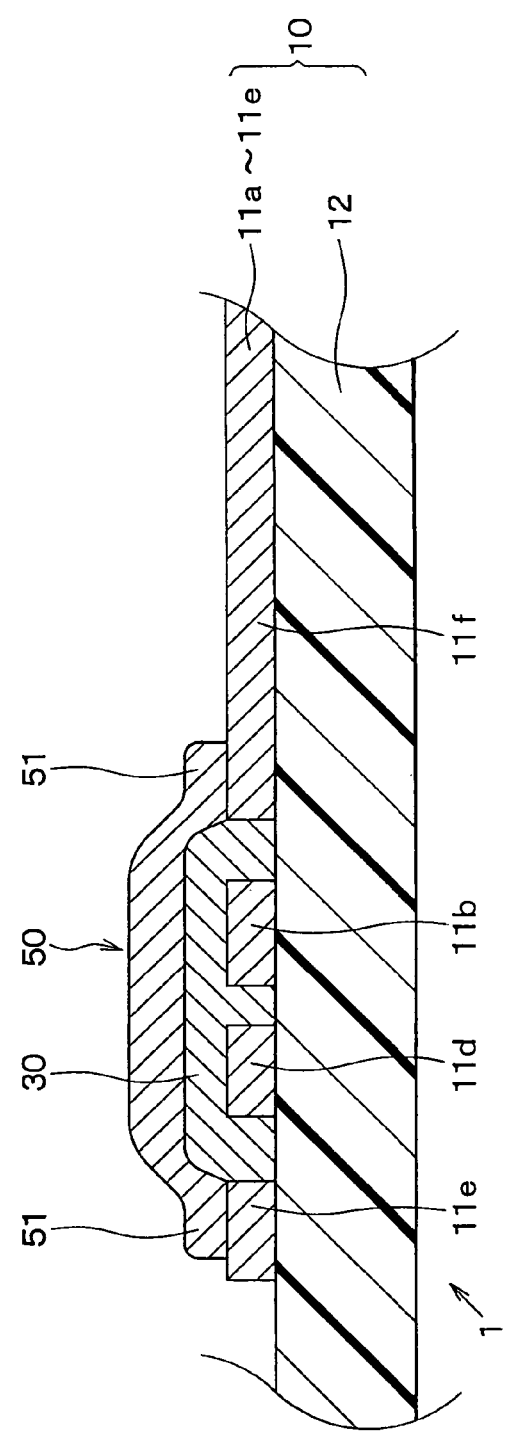
FIG. 3 is a cross-sectional view of the circuit board shown in FIG. 1 sectioned by line III—III according to the first embodiment.

FIG. 2 is a cross-sectional view of the circuit board shown in FIG. 1 cross-sectioned with line II—II. The circuit board 1 has an electrical insulating film 30 that covers the printed circuit patterns 11a–11d on the PCB 10. The insulating film 30 is the insulating layer of the circuit board 1 and formed by silk-screen printing solder resist over a predetermined area. The insulating film 30 has holes 31 for exposing electronic components including the CPU 17.

The circuit board 1 includes an electromagnetic interference sealed layer 40 made of a conductive film. The sealed layer 40 is formed on the insulating substrate 12 by screen printing conductive paste to cover the insulating film 30 as indicated with hatching in FIG. 1. The conductive paste is mainly made of a resin binder and a conductive powder.

The film thickness of the sealed layer 40 is required to be larger as the grain diameter of the conductive powder becomes larger for obtaining stable conductivity of the sealed layer 40. Thus, the grain diameter of the conductive powder and the film thickness of the sealed layer 40 are predetermined. For example, if the average grain diameter of the conductive powder is approximately 8 μm, the film thickness of the sealed layer 40 is equal to or larger than 15 μm.

The sealed layer 40 has holes 41 for exposing the electronic components including the CPU 17. The holes 41 are located to match the holes 31 of the insulating film 30. The insulating film 30 has several holes 32 for exposing parts of the ground lines 11d to provide connection between the sealed layer 40 and the ground lines 11d. Namely, portions of the sealed layer 40 that match the holes 32 are connecting points 42 that are electrically connected with the ground lines 11d.

Figure 4:
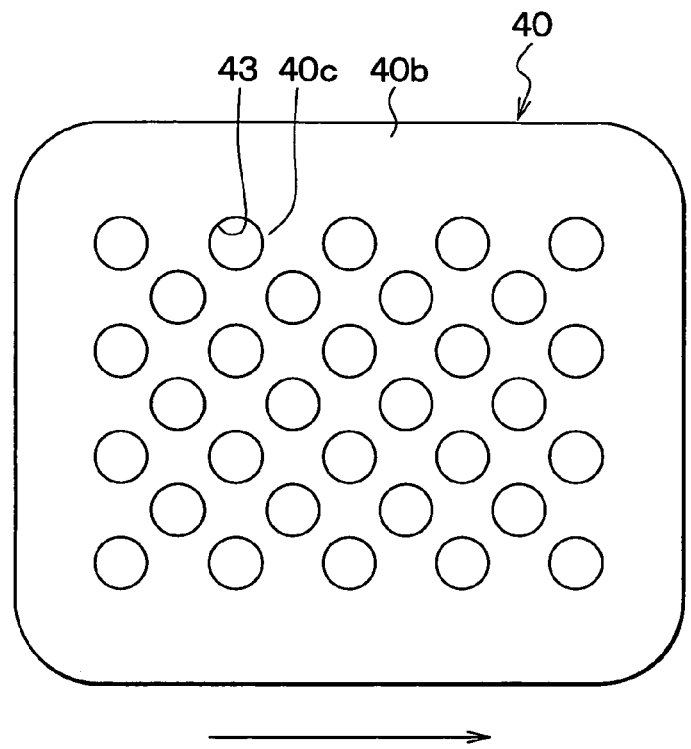
FIG. 4 is a top view of an electromagnetic interference sealed layer included in the circuit board according to the first embodiment.

The rear view of the sealed layer 40 is shown in FIG. 4. The sealed layer 40 has multiple through holes 43. Although the sealed layer 40 is depicted in a rectangular form in FIG. 4 for brevity, it is actually formed in a shape shown in FIG. 1 to cover areas from which the noise is radiated.

With the above configuration, the distributed capacitance is produced between the printed circuit patterns and their adjacent sealed layer rather than between adjacent printed circuit patterns. Since the sealed layer is connected with the ground lines 11d, the noise can be reduced.

In the sealed layer 40, more edges (through hole edges 40c) are formed in addition to the outer edges 40b after the through holes 43 are formed. Namely, a total area of edges, at which the thickness of the conductive paste is large due to surface tension, increases. Thus, the sealed layer 40 can be easily formed in a predetermined thickness, and stability in conductivity of the sealed layer 40 can be maintained.

The holes 41 and the through holes 43 are provided for different purposes. The holes 41 are provided for protecting the electronic components including the CPU 17 from being shorted by the sealed layer 40. The through holes 43 are provided for maintaining the stability in the conductivity of the sealed layer 40. Accordingly, the holes 41 are formed to match shapes of the electronic components; however, the through holes 43 are formed regardless of the shapes of the electronic components. Furthermore, the through holes 43 are formed in the same shapes and orderly arranged in rows.

A ratio of opening areas of the through holes 43 over an area of the sealed layer 40 on the insulating substrate 12, which is indicated with hatching in FIG. 1, is predetermined. If the ratio is too large, noise reduction effect becomes low. If the ratio is too small, effect of maintaining the conductivity of the sealed layer 40 becomes low. Thus, the radio is predetermined to provide appropriate noise reduction effect and the conductivity maintaining effect.

Moreover, a jumper line 50, indicated with hatching in FIG. 1, is also formed in a manner that the conductivity of the sealed layer 40 improves. The jumper line 50 establishes connection between the first land portion (first portion) 11e and the second land portion (second portion) 11f of the printed circuit patterns 111–11d.

Referring to FIG. 4, the insulating film 30 is provided on the PCB 10 for covering the printed circuit patterns 11a–11d. The insulating film 30 forms the insulating layer of the circuit board 1. The jumper line 50 is provided by a conductive film formed on the insulating film 30 for covering. The jumper line 50 is formed by screen printing conductive paste 40a. The jumper line 50 has the through holes 43 similar to the through holes shown in FIG. 4.

The jumper line 50 has edges around the through holes 43 other than the outer edges. Namely, a total area of edges, at which the thickness of the conductive paste is large due to surface tension, increases. Thus, the jumper line 50 can be easily formed in a predetermined thickness, and stability in conductivity of the jumper line 50 can be maintained.

If a width of the jumper line 50 is large, their electrical resistance is low. However, the jumper line 50 takes up a large amount of space on the insulating substrate 12, which makes it difficult to arrange the jumper line 50 in the limited space. The thickness of the jumper line 50 can be increased without increasing their widths in this embodiment. Therefore, the electrical resistance of the jumper line 50 can be easily lowered within the limited space. It is preferable to apply this embodiment to the jumper line 50 through which a large amount of current flows.

The ends of the jumper line 50 are connected with the first land portion 11e and the second land portion 11f, respectively. The conductive paste 40 that forms the jumper line 50 is divided by the slits 44. Portions of the conductive paste divided by the slits 44 are at the same potential. Furthermore, variations in the thickness can be reduced because the jumper line 50 can be formed in the predetermined thickness. As a result, the resistance of the jumper line 50 can be easily estimated and a circuit can be designed based on the estimated resistance.

[Second Embodiment]

Figure 5:
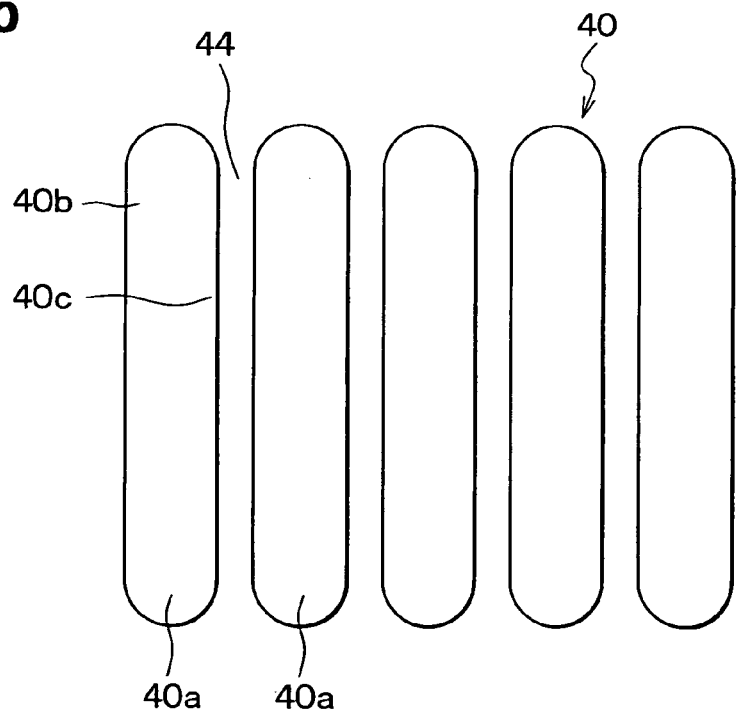
FIG. 5 is a top view of an electromagnetic interference sealed layer included in the circuit board according to the second embodiment.

The through holes 43 of the first embodiment are formed in a shape of slit as shown in FIG. 5 and referred to as slits 44. The sealed layer 40 or the jumper line 50 is formed by the conductive paste 40a. Other structures of the circuit 1 are the same as that of the first embodiment.

The sealed layer 40 and the jumper line 50 have edges around the slits 44 other than the outer edges. Therefore, the same effect as the first embodiment can be obtained. The slits 44 are formed in shapes that do not correspond to the shapes of the electronic components, and several of them in the same shape are orderly arranged in rows. A ratio of opening areas of the slits 44 over the entire area of the sealed layer surface on the insulating substrate 12 is predetermined to provide appropriate noise reduction effect and the conductivity maintaining effect.

The ends of the jumper line 50 are connected with the first land portion 11e and the second land portion 11f, respectively. The conductive paste 40 that forms the jumper line 50 is divided by the slits 44, namely, the jumper line 50 includes multiple portions formed by screen printing the conductive paste 40. The portions of the jumper line 50 are connected with the ground lines 11d and at the same potential.

[Third Embodiment]

Figure 6:
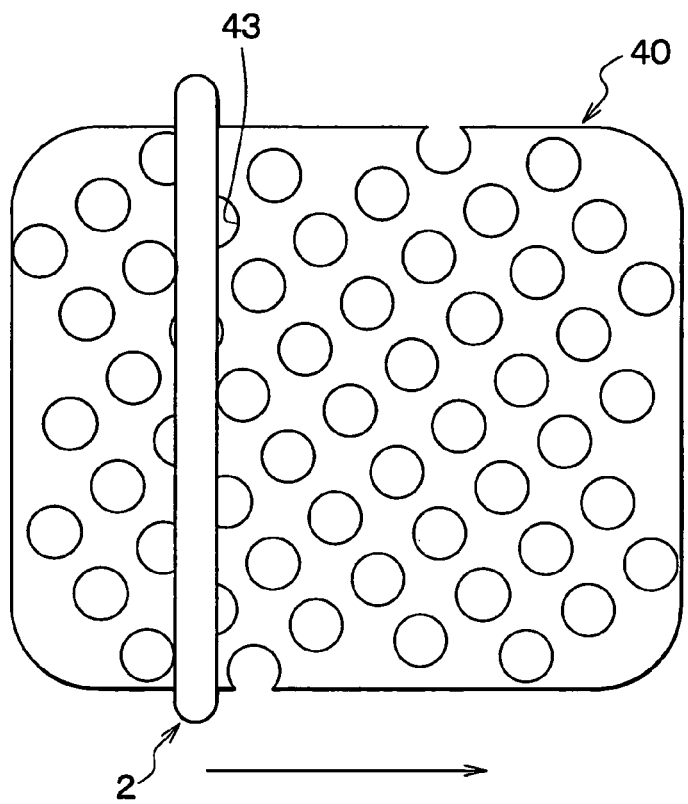
FIG. 6 is a top view of an electromagnetic interference sealed layer included in the circuit board according to the third embodiment.

During the screen printing of the conductive paste 40a, the film thickness of the sealed layer 40 or the jumper line 50 becomes thin if some of the conductive paste 40a linearly spreads in the longitudinal direction of a squeegee 2 set in a position for the screen printing. More specifically, the film thickness becomes thin when the conductive paste 40a spreads in the direction indicated with an arrow in FIG. 6, which is perpendicular to the printing direction.

Figure 9A:
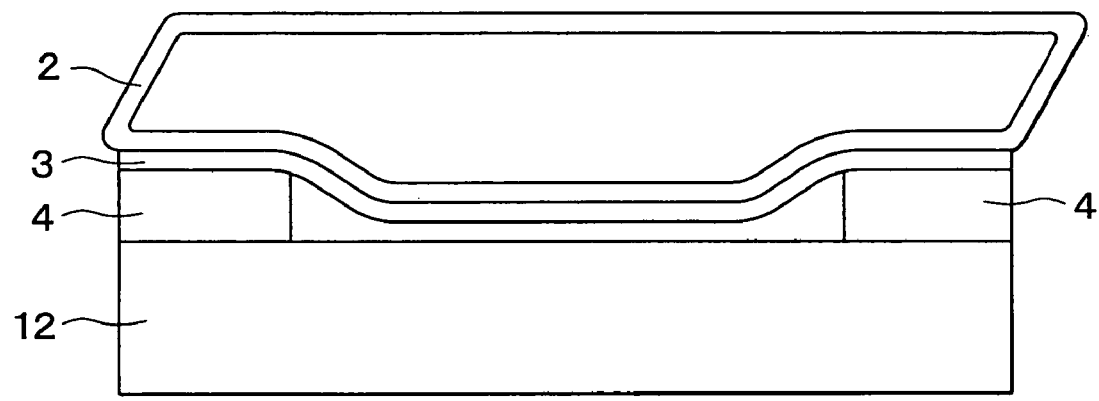
FIG. 9A is a schematic view of the circuit board with a squeegee, a screen, and screen masks for showing improvement of a related art.
Figure 9B:
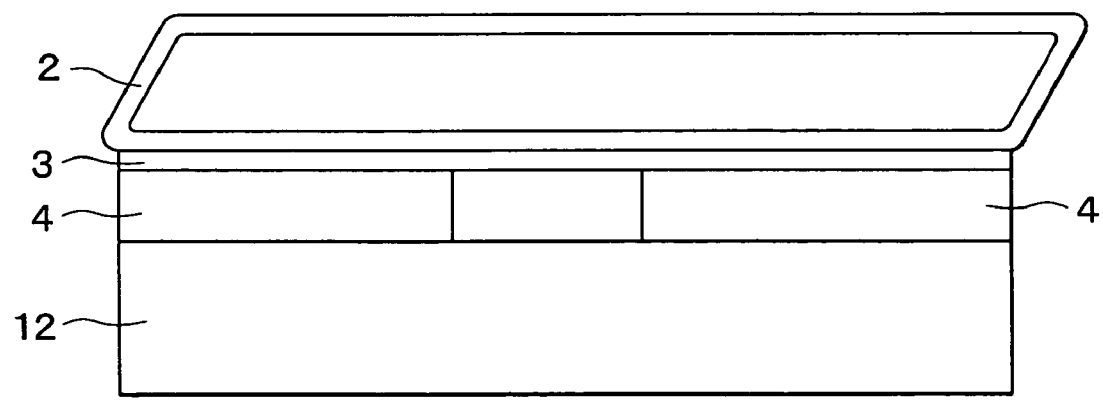
FIG. 9B is a schematic view of the circuit board with a squeegee, a screen, and screen masks according the fourth embodiment.

To solve this problem, multiple through holes 43 are provided so that the conductive paste 40a that linearly spreads in the longitudinal direction of the squeegee 2 is reduced. The multiple through holes 43 are arranged in rows on lines that cross the long side of the squeegee 2 set in the position for the screen printing and off-centered from each other with respect to lines parallel to the long side of the squeegee 2. The conductive paste 40a that linearly spreads in the longitudinal direction can be reduced and the conductive paste 40a evenly spreads in the printing direction. As a result, a gap between the screen masks 4 can be reduced as shown in FIG. 9B, and a sag of the screen 3 caused by the squeegee 2 can be reduced. The conductive paste 40a that are squeezed out by the squeegee 2 can be reduced, and therefore the sealed layer 40 and the jumper line 50 can be formed in predetermined thicknesses.

Moreover, the conductive paste 40a that linearly spreads in the longitudinal direction of the squeegee 2 is reduced in comparison with the configuration in which the through holes 43 are arranged in rows parallel to the long side of the squeegee 2. Thus, the sealed layer 40 and the jumper line 50 can be even more easily formed in predetermined thicknesses.

[Modification of Third Embodiment]

Figure 7:
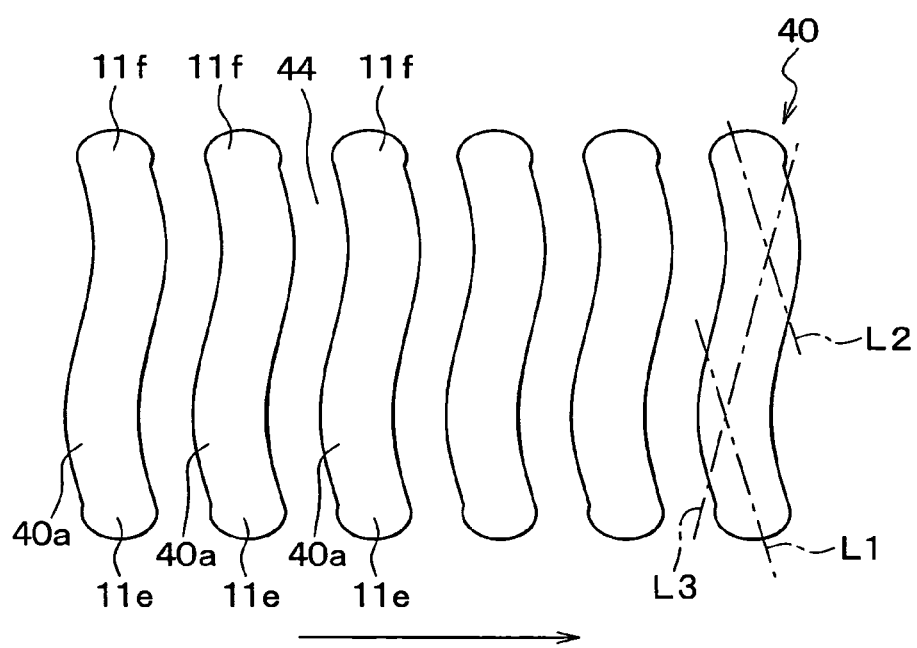
FIG. 7 is a top view of an electromagnetic interference sealed layer according to a modification of the third embodiment.

When the slits 44 are provided instead of the through holes 43 as in the second embodiment, the slits 44 may be formed in serpentine shapes as shown in FIG. 7. The slits 44 extend in the directions that cross the longitudinal direction of the squeegee 2 during the screen printing. The directions indicated with dashed lines L1, L2, L3 cross the longitudinal direction of the squeegee 2. With this configuration, the conductive paste 40a that linearly spreads in the longitudinal direction of the squeegee 2 is reduced in comparison with the configuration in which the through holes 43 are arranged in rows parallel to the long side of the squeegee 2. Thus, the sealed layer 40 and the jumper line 50 can be even more easily formed in predetermined thicknesses.

[Fourth Embodiment]

Figure 8A:
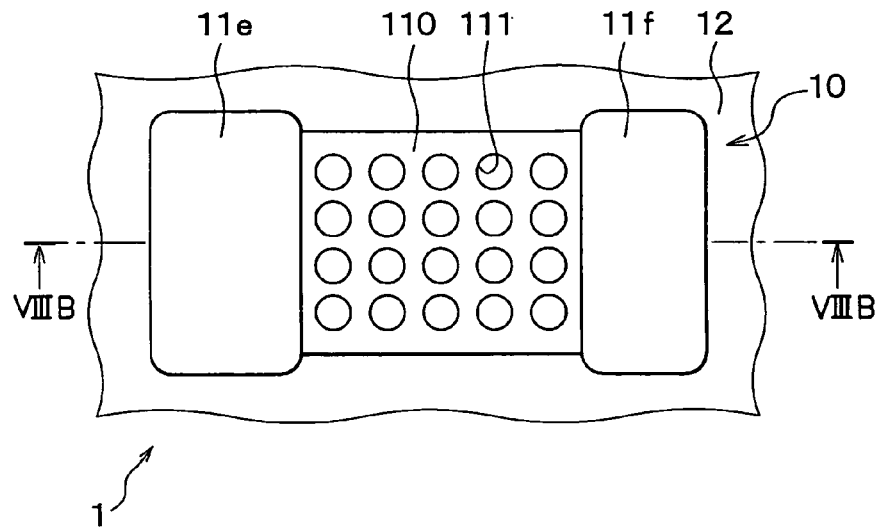
FIG. 8A is a top view of a circuit board according to the fourth embodiment of the present invention.
Figure 8B:
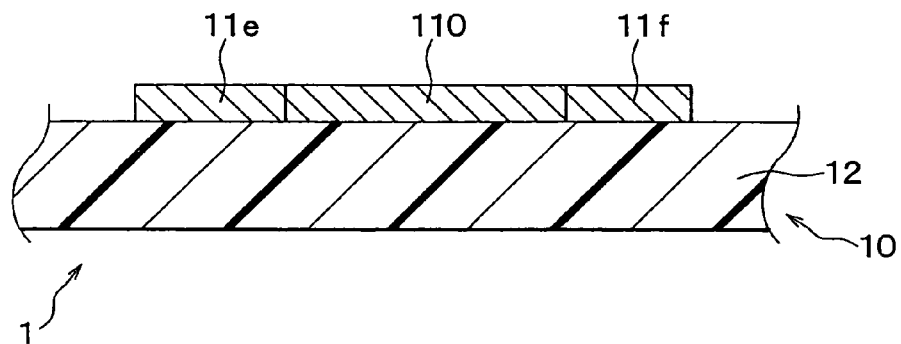
FIG. 8B is a cross-sectional view of the circuit board shown in FIG. 8A sectioned by line VIIIB—VIIIB according to the fourth embodiment.
Figure 10:
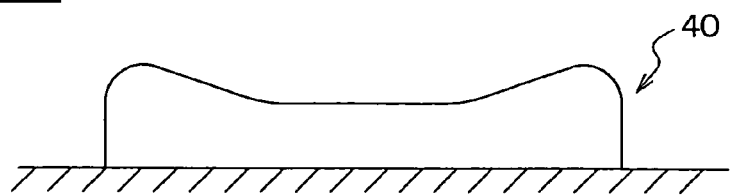
FIG. 10 is a side view of conductive paste on a circuit board according to a related art.

Referring to FIGS. 8A and 8B, the first land portion (first circuit pattern) 11e, the second land portion (second circuit pattern) 11f, a connecting line 110 are formed on the insulating substrate 12. The connecting line 110 includes multiple through holes 111 similar to the through holes 43. Alternatively, the connecting line 110 includes multiple slits similar to the slits 44. The first land portion 11e, the second land portion 11f, and the connecting line 110 are formed by screen printing conductive paste 40a on the substrate 12.

The first and the second ends of the connecting line 110 are connected with the first circuit pattern 11e and the second circuit pattern 11f, respectively for establishing connection between the first and the second circuit patterns 11e, 11f. The conductive paste 40a that forms the connecting line 110 is divided by the slits 44, namely, the connecting line 110 includes multiple portions formed by screen printing the conductive paste 40a. The portions of the connecting line 110 are at the same potential. With this configuration, more edges are formed in comparison with the configuration in which the connecting line 110 is formed in a single portion of the conductive paste 40a. Thus, the connecting line 110 can be easily formed in a predetermined thickness, and the conductivity of the connecting line 110 can be maintained.

The connecting lines including the jumper line 50 and the connecting line 110 are not formed in even thicknesses by simply screen printing the conductive paste 40a. Variations in thicknesses are caused according to printing conditions include the direction in which the squeegee 2 squeezes out the conductive paste 40a. The variations cause variations in electrical resistance of the connecting lines 50, 110. This makes it difficult to design the circuit board 1.

To solve this problem, the connecting lines 50, 110 are formed so that the conductive paste 40a spreads in the direction that crosses the longitudinal direction of the squeegee 2. With this configuration, the conductive paste 40a that linearly spreads in the longitudinal direction of the squeegee 2 can be reduced. As a result, the connecting lines 50, 110 can be even more easily formed in predetermined thicknesses. Variations in thicknesses of the connecting lines 50, 110 can be reduced with this configuration regardless of the printing conditions. Therefore, variations in resistance of the conductive paste 40a applied for the connecting lines 50, 110 can be reduced.

The present invention should not be limited to the embodiment previously discussed and shown in the figures, but may be implemented in various ways without departing from the spirit of the invention. For example, a keyless entry receiver may be mounted on the circuit board 1. Since noise produced by the CPU 17 can be reduced with the circuit board 1, the operation stability of the receiver can be improved. Furthermore, the operable area of the receiver can be expanded. A flexible board can be used for the insulating substrate 12.

The circuit board 1 may be used in a vehicle, especially for a circuit board to operate instruments installed in an instrument panel of a vehicle. The circuit board 1 may be used in a display device that is installed for providing driving information of a vehicle to a driver.

What is claimed is:

1. A circuit board comprising:
   a printed circuit board layer including an insulating substrate on which circuit patterns are printed;
   an insulating layer formed on top of the printed circuit board layer for covering the circuit patterns; and
   an electromagnetic interference sealed layer formed on top of the insulating layer for
   covering the insulating layer and connected with a ground portion of the circuit patterns, wherein the electromagnetic interference sealed layer is formed by screen printing electrically conductive paste, and
   the electromagnetic interference sealed layer has through holes, the through holes reaching the insulating layer so that the insulating layer is disposed between the through holes and the circuit patterns.

2. The circuit board according to claim 1, further comprising a jumper line for establishing connection between a first portion and a second portion of the circuit patterns, wherein the jumper line has through holes.

3. The circuit board according to claim 1, further comprising:
   a first circuit pattern and a second circuit pattern screen printed on the insulating substrate;
   a connecting line for establishing connection between the first and the second circuit patterns, wherein
   the connecting line is formed by screen printing electrically conductive paste, and
   the connecting line has through holes.

4. The circuit board according to claim 1, wherein the through holes are arranged in rows on lines that cross a long side of a squeegee set in a position for the screen printing and off-centered from each other with respect to lines parallel to the long side of the squeegee.

5. The circuit board according to claim 1, wherein the through holes are formed in a shape of slits.

6. The circuit board according to claim 5, wherein the through holes extend in directions that cross a longitudinal direction of the squeegee set in a position for the screen printing.

7. The circuit board according to claim 2, wherein the jumper line includes a plurality of portions formed by screen printing the conductive paste.

8. The circuit board according to claim 3, wherein the connecting line includes a plurality of portions formed by screen printing the conductive paste.

9. The circuit board according to claim 7, wherein the conductive paste spreads in a direction crossing the longitudinal direction of the squeegee set in a position for the screen printing.

10. The circuit board according to claim 8, wherein the conductive paste spreads in a direction crossing the longitudinal direction of the squeegee during the screen printing.

11. The circuit board according to claim 1, wherein the circuit board is used in a vehicle.

12. The circuit board according to claim 11, wherein the circuit board is used in a display device installed for providing driving information of a vehicle to a driver.

13. The circuit board according to claim 1, further comprising:
   an electric device connecting to the circuit patterns, wherein the insulating layer and the electromagnetic interference sealed layer include at least one other through hole for exposing the electric device from the insulating layer and the electromagnetic interference sealed layer to an outside of the circuit board.

14. The circuit board according to claim 13, wherein the at least one other through hole matches a shape of the electric device.

* * * * *